US006969558B2

(12) United States Patent
Walston et al.

(10) Patent No.: US 6,969,558 B2
(45) Date of Patent: *Nov. 29, 2005

(54) LOW SULFUR ARTICLE HAVING A PLATINUM-ALUMINIDE PROTECTIVE LAYER, AND ITS PREPARATION

(75) Inventors: William S. Walston, Mason, OH (US); Jon C. Schaeffer, Simpsonville, SC (US); Wendy H. Murphy, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/715,783

(22) Filed: Nov. 18, 2003

(65) Prior Publication Data

US 2004/0123923 A1 Jul. 1, 2004

Related U.S. Application Data

(63) Continuation of application No. 10/013,632, filed on Dec. 10, 2001, application No. 10/715,783, which is a division of application No. 09/328,574, filed on Jun. 9, 1999, now Pat. No. 6,333,121, which is a continuation-in-part of application No. 09/149,018, filed on Sep. 8, 1998, now Pat. No. 6,551,423, application No. 10/715,783, which is a continuation-in-part of application No. 08/398,259, filed on Mar. 3, 1995, now Pat. No. 6,656,605, which is a continuation-in-part of application No. 07/960,494, filed on Oct. 13, 1992, now Pat. No. 5,538,796.

(51) Int. Cl.$^7$ .............................. B32B 15/04; F03B 3/12
(52) U.S. Cl. ....................... 428/632; 428/615; 428/670; 428/680; 428/655; 428/656; 428/941; 416/241 R

(58) Field of Search ................... 427/404, 405, 427/419.1, 419.2; 428/632, 615, 680, 670, 655, 656, 941; 416/241 R

(56) References Cited

U.S. PATENT DOCUMENTS

| 2,246,162 | A | 6/1941 | Benjamin |
| 2,763,584 | A | 9/1956 | Badger |
| 3,544,348 | A | 12/1970 | Boone et al. |

(Continued)

FOREIGN PATENT DOCUMENTS

| EP | 0 718 419 A2 | 6/1996 |
| EP | 0 733 723 A1 | 9/1996 |
| EP | 0 905 281 A1 | 3/1999 |

OTHER PUBLICATIONS

J.G. Smeggil, "The Effect of Indigenous Sulfur on the High Temperature Oxidation Performance of the Chromia Forming Alloy NI-40 Wt% Cr", in Corrosion and Particle Erosion at High Temperature, The Minerals, Metals, & Materials Society, 1989, pp. 403-424.

(Continued)

Primary Examiner—Jennifer McNeil
(74) Attorney, Agent, or Firm—McNees Wallace & Nurick LLC

(57) ABSTRACT

A coated article is prepared by furnishing an nickel-base article substrate having a free sulfur content of more than 0 but less than about 1 part per million by weight. A protective layer is formed at a surface of the article substrate. The protective layer includes a platinum aluminide diffusion coating. The protective layer may be substantially yttrium-free, or have a controlled amount of yttrium. A ceramic layer may overlie the protective layer.

25 Claims, 2 Drawing Sheets

U.S. PATENT DOCUMENTS

| | | |
|---|---|---|
| 3,581,491 A | 6/1971 | Bornstein et al. |
| 3,819,338 A | 6/1974 | Bungardt et al. |
| 3,853,540 A | 12/1974 | Schlatter et al. |
| 3,928,026 A | 12/1975 | Hecht et al. |
| 3,979,273 A | 9/1976 | Panzera et al. |
| 4,095,003 A | 6/1978 | Weatherly et al. |
| 4,142,023 A | 2/1979 | Bornstein et al. |
| 4,152,223 A | 5/1979 | Wallace et al. |
| 4,328,285 A | 5/1982 | Siemers et al. |
| 4,399,199 A | 8/1983 | McGill et al. |
| 4,477,538 A | 10/1984 | Clarke |
| 4,530,720 A | 7/1985 | Moroishi et al. |
| 4,626,408 A | 12/1986 | Osozawa et al. |
| 4,826,738 A | 5/1989 | Smeggil |
| 4,895,201 A | 1/1990 | DeCrescente et al. |
| 4,900,640 A | 2/1990 | Bell et al. |
| 5,000,371 A | 3/1991 | Johnson |
| 5,034,284 A | 7/1991 | Bornstein et al. |
| 5,057,196 A | 10/1991 | Creech et al. |
| 5,254,413 A | 10/1993 | Maricocchi |
| 5,262,245 A | 11/1993 | Ulion et al. |
| 5,270,123 A | 12/1993 | Walston et al. |
| 5,344,510 A | 9/1994 | Allen et al. |
| 5,346,563 A | 9/1994 | Allen et al. |
| 5,443,789 A | 8/1995 | Harris et al. |
| 5,514,482 A | 5/1996 | Strangman |
| 5,538,796 A | 7/1996 | Schaffer et al. |
| 5,658,614 A | 8/1997 | Basta et al. |
| 5,667,663 A | 9/1997 | Rickerby et al. |
| 5,716,720 A | 2/1998 | Murphy |
| 5,788,823 A | 8/1998 | Warnes et al. |
| 5,922,409 A | 7/1999 | McMordic et al. |
| 6,228,513 B1 | 5/2001 | Jaslier et al. |
| 6,332,937 B1 | 12/2001 | Jaslier et al. |
| 6,333,121 B1 | 12/2001 | Walston et al. |
| 6,551,423 B1 | 4/2003 | Spitsberg et al. |
| 6,656,533 B2 * | 12/2003 | Walston et al. ............ 427/404 |
| 6,656,605 B1 | 12/2003 | Schaeffer et al. |
| 6,797,408 B2 | 9/2004 | Walston et al. |

OTHER PUBLICATIONS

James L. Smialek, "The Effect of Sulfur Removal on $Al_2O_3$ Scale Adhesion," in Corrosion and Particle Erosion at High Temperature, The Minerals, Metals, & Materials Society, 1989, pp. 425–457.

B.K. Tubbs and J.L. Smialek, "Effect of Sulfur Removal on Scale Adhesion," in Corrosion and Particle Erosion at High Temperature, The Minerals, Metals, & Materials Society, 1989, pp. 459–486.

N.S. Bornstein, "Study to Demonstrate Superior Oxidation Resistance of Aluminide Coatings," Report No. R90–917552–1, Final Report to Naval Air Development Center, 1989.

M.A. Decrescente and N.S. Bornstein, "Scale Adherence Effects in Oxidation and Sulfidation," NASA Report NAS–23–27, Nov. 1990.

J.L. Smialek et al., "Effects of hydrogen annealing, sulfur segregation and diffusion on the cyclic oxidation resistance of superalloys: a review," Thin Solid Fims, vol. 253 (1994), pp. 285–292.

C.L. Briant et al., "The Effect of Annealing and Desulfurization on Oxide Spallation of Turbine Airfoil Material," Scripta Metallurgica and Materialia, vol. 32, No. 9, 1995, pp. 1447–1451.

J.C. Schaeffer et al., "The Effect of Surface Condition and Sulfur on the Environmental Resistance of Airfoils," Oxidation of Metals, vol. 43, Nos. 1/2, 1995, pp. 1–23.

* cited by examiner

LOW SULFUR ARTICLE HAVING A PLATINUM-ALUMINIDE PROTECTIVE LAYER, AND ITS PREPARATION

This application is a continuation of application Ser. No. 10/013,632, filed Dec. 10, 2001, entitled LOW SULFUR ARTICLE HAVING A PLATINUM-ALUMINIDE PROTECTIVE LAYER AND ITS PREPARATION now allowed, for which priority is claimed.

This application is a divisional of application Ser. No. 09/328,574, filed Jun. 9, 1999 now U.S. Pat. No. 6,333,121, which is a continuation-in-part of application Ser. No. 09/149,018, filed Sep. 8, 1998 now U.S. Pat. No. 6,551,423, for which priority is claimed and whose disclosure is incorporated by reference. This application also is a continuation-in-part of pending application Ser. No. 081398,254, filed Mar. 3, 1995 now U.S. Pat. No. 6,656,605, for which priority is claimed; which in turn is a continuation-in-part of application Ser. No. 07/960,494, filed Oct. 13, 1992, now U.S. Pat. No. 5,538,796, for which priority is claimed.

BACKGROUND OF THE INVENTION

This application relates to coated articles, and, more particularly, to a superalloy article having a metallic overlay protective coating.

In an aircraft gas turbine (jet) engine, air is drawn into the front of the engine, compressed by a shaft-mounted compressor, and mixed with fuel. The mixture is burned, and the hot exhaust gases are passed through a turbine mounted on the same shaft. The flow of combustion gas turns the turbine, which turns the shaft and provides power to the compressor. The hot exhaust gases flow from the back of the engine, driving it and the aircraft forwardly.

The hotter the combustion and exhaust gases, the more efficient is the operation of the jet engine. There is thus an incentive to raise the combustion and exhaust gas temperatures. However, the maximum temperature of the combustion gases is normally limited by the materials used to fabricate the turbine vanes and turbine blades of the turbine. In current engines, the turbine vanes and blades are made of nickel-based superalloys, and can operate at temperatures of up to 1900–2100 F.

Many approaches have been used to increase the operating temperature limit of the turbine blades and vanes to their current levels. The composition and processing of the materials themselves have been improved, and physical cooling techniques are employed.

In another approach, a protective layer or a ceramic/metal thermal barrier coating (TBC) system is applied to the turbine blade or turbine vane component, which acts as a substrate. The protective layer with no overlying ceramic layer (in which case the protective layer is termed an "environmental coating") is useful in intermediate-temperature applications. The currently known protective layers include diffusion aluminides and MCrAlY(X) overlays.

A ceramic thermal barrier coating layer may be applied overlying the protective layer, to form a thermal barrier coating system (in which case the protective layer is termed a "bond coat"). The thermal barrier coating system is useful in higher-temperature applications. The ceramic thermal barrier coating insulates the component from the combustion gas, permitting the combustion gas to be hotter than would otherwise be possible with the particular material and fabrication process of the substrate.

Although these coating systems are operable, there is always the need to achieve further improvements in maximum operating temperatures and times of coated articles. The present invention fulfills this need, and further provides related advantages.

BRIEF SUMMARY OF THE INVENTION

The present invention provides a method for preparing a coated article protected by a protective layer, and the article itself. The protective layer is suitable for use as an environmental coating with no overlying thermal barrier coating, or as the bond coat for a thermal barrier coating. The elevated temperature oxidation performance of the coated article is improved over that of conventional coated articles.

A coated article comprises an article substrate having a free sulfur content of more than 0 but less than about 1 part per million by weight (ppmw), and a protective layer at a surface of the article substrate. The article substrate is preferably a nickel-base superalloy, in the shape of a component of a gas turbine aircraft engine such as a turbine blade or turbine vane. The protective layer comprises a platinum aluminide diffusion coating. A thermal barrier coating layer made of a ceramic such as yttria-stabilized zirconia may overlie the protective layer, which is then termed a bond coat. There may instead be no overlying ceramic thermal barrier coating layer, in which case the protective layer is termed an environmental coating. Both the protective layer and the ceramic thermal barrier coating layer, where present, are also low in sulfur, preferably less than about 1 ppm by weight.

The protective layer may be substantially yttrium free, with less than about 10 parts per million. The protective layer may instead contain a substantial amount of yttrium, typically from about 10 to about 200 parts per million, for other applications.

The substrate article with low free sulfur content may be furnished in a variety of ways. The base metal may be selected to have a low free sulfur content. The composition of the base metal may be modified to result in a low free sulfur content. In one approach, a sulfur-scavenging element such as hafnium or zirconium is provided in the base metal in an amount sufficient to reduce the free sulfur content to less than about 1 part per million (ppm) by weight. In another approach, a conventional high-sulfur base metal can be provided. The base metal is contacted to a reducing gas to remove sulfur and reduce the free sulfur to the required low level. For example, the base metal can be contacted at elevated temperatures to hydrogen or a hydrogen-containing gas that desulfurizes the metal. In yet another approach, the molten base metal may be placed into contact with a reactive element such as calcium or magnesium, to react with and reduce the free sulfur content.

In the past, in many instances the sulfur content of the underlying substrate upon which the protective layer is deposited has not been reported. It may not be concluded from the absence of reporting of the sulfur content that the sulfur content is zero or otherwise less than about 1 part per million. Instead, in such situations it may be concluded that the sulfur content is likely in the typical range of about 5 to about 30 parts per million by weight, and that the sulfur content was not reported because there was no realization of its significance at the time.

The coated article of this type can be used in high-temperature applications in severe environments. A preferred application is as a gas turbine blade or vane, but the invention is not so limited. Other features and advantages of the present invention will be apparent from the following more detailed description of the preferred embodiment,

DETAILED DESCRIPTION OF THE INVENTION

Figure 1:
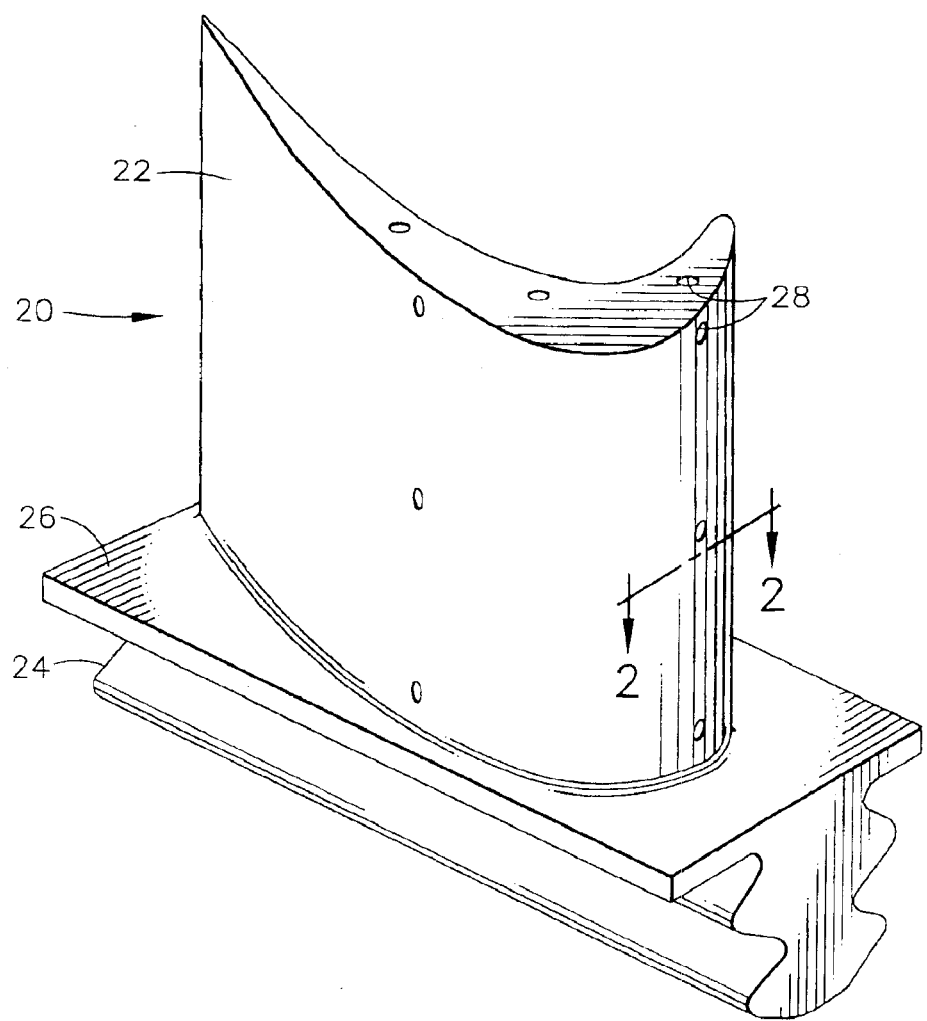
FIG. 1 is a perspective view of a gas turbine component article.

FIG. 1 depicts a component of an aircraft gas turbine engine such as a turbine blade or turbine vane, and in this case is depicted as a turbine blade 20. Other gas turbine engine components can benefit from the coating approach of the invention, such as, for example, combustor liners, turbine seals, exhaust nozzles, and shrouds. The turbine blade 20 includes an airfoil 22 against which the flow of hot exhaust gas is directed. The turbine blade 20 is mounted to a turbine disk (not shown) by a dovetail 24 which extends downwardly from the airfoil 22 and engages a slot on the turbine disk. A platform 26 extends longitudinally outwardly from the area where the airfoil 22 is joined to the dovetail 24. A number of cooling channels may extend through the interior of the airfoil 22, ending in openings 28 in the surface of the airfoil 22. A flow of cooling air is directed through the cooling channels, to reduce the temperature of the airfoil 22.

Figure 2:
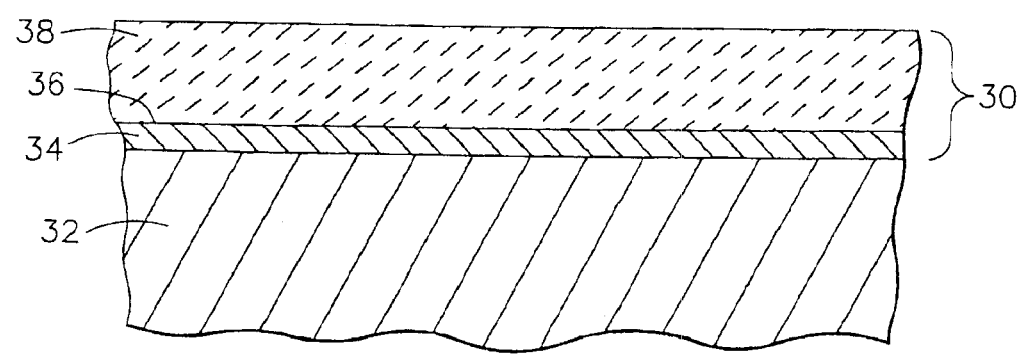
FIG. 2 is a sectional view through the article of FIG. 1, taken generally along line 2—2, illustrating a protective layer on the surface of the article.

FIG. 2 illustrates a protective system 30 deposited upon the turbine blade 20, which thereby acts as a substrate 32. The substrate 32 may be formed of any operable material, but a preferred base metal from which the article substrate is formed is a nickel-base superalloy. A nickel-base superalloy has more nickel than any other element. A preferred nickel-base alloy is Rene N5, which has a nominal composition in weight percent of 7.5 percent cobalt, 7 percent chromium, 6.2 percent aluminum, 6.5 percent tantalum, 5 percent tungsten, 1.5 percent molybdenum, 3 percent rhenium, balance nickel. The article substrate is preferably, but not necessarily, directionally solidified or single crystal.

The substrate 32 has a free sulfur content of less than about 1 part per million by weight (ppmw), more preferably less than about 0.5 parts per million by weight, and most preferably on the order of about 0.2 parts per million by weight. Larger amounts of free sulfur interfere with the adherence of coatings to the surface of the substrate during service. The free sulfur content need meet this requirement only locally, near the surface of the substrate 32. Because sulfur diffuses through the substrate 32 during elevated temperature exposure, it is, however, preferred that the free sulfur content be below about 1 ppm throughout at least most of, and most preferably all, the substrate material.

The substrate 32 has a yttrium content of no greater than about 200 parts per million by weight. If the substrate has a yttrium content of more than about 200 parts per million by weight, it is extremely difficult to cast, with the result that manufacturing costs are increased, and the added yttrium increases the cost but has little added effect on improved properties. For less demanding applications, the substrate has substantially no yttrium, which is herein defined as less than about 10 parts per million by weight yttrium. The yttrium in this range adds little to the cost of the substrate material, and does not substantially increase the difficulty in casting the substrate material. However, in some more demanding applications such as articles exposed to very high temperatures for extended periods of time, the yttrium is present in an amount of from about 10 to about 200 parts per million by weight. The added cost and casting difficulties associated with this higher yttrium range are offset by the improved performance that is achieved with more than about 10 parts per million by weight of yttrium.

A protective layer 34 is present at a free surface 36 of the substrate 32. The protective layer 34 is a diffusion platinum aluminide. The diffusion platinum aluminide of the protective layer 34 of FIG. 2 is a metallic composition containing platinum, aluminum, and the elements present in the substrate 32. The diffusion aluminide is formed by depositing one or more sublayers overlying the surface 36, and then interdiffusing the deposited sublayers. For example, a sublayer containing platinum is first deposited upon the free surface 36, and then a sublayer containing aluminum is deposited over the platinum sublayer at a temperature sufficient that the platinum and aluminum sublayers interdiffuse with each other and with the material of the substrate to form a platinum-aluminum coating layer. In a preferred embodiment, the platinum is present in an average amount of from about 20 to about 30 weight percent, preferably from about 25 to about 28 weight percent, of the protective layer 34, and the aluminum is present in an average amount of from about 14 to about 25 weight percent, preferably from about 18 to about 22 weight percent, of the protective layer 34. The remainder of the protective layer 34 comprises elements interdiffused from the substrate 32. The protective layer 34 is preferably from about 0.0005 to about 0.004 inches in thickness, but lesser or greater thicknesses are operable although less desirable.

A ceramic layer 38 optionally overlies the protective layer 34. The ceramic layer 34 is preferably yttria-stabilized zirconia, which is zirconium oxide containing from about 6 to about 8 weight percent of yttrium oxide. Other operable ceramic materials may be used as well. The ceramic layer 34 is preferably from about 0.004 inch to about 0.025 inch thick, most preferably from about 0.005 inch to about 0.015 inch thick. (FIG. 2 is not drawn to scale.)

Figure 3:
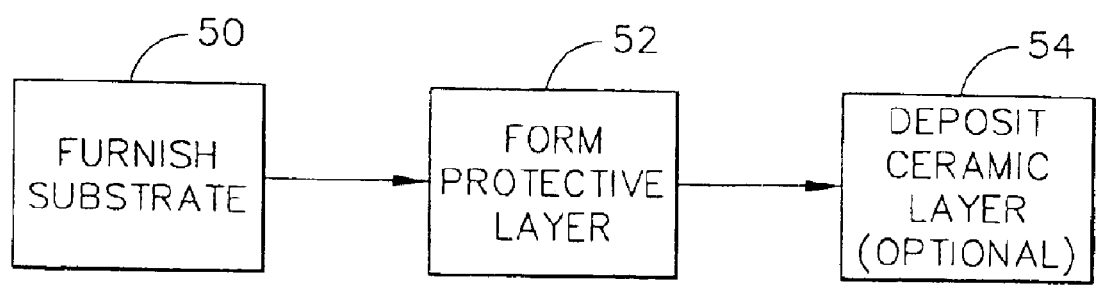
FIG. 3 is a block diagram of one embodiment of the approach of the invention.

FIG. 3 depicts a method of preparing a coated article such as the turbine blade 20. An article substrate 32 having a free sulfur content of less than about 1 part per million by weight, preferably less than 0.5 parts per million by weight, and most preferably about 0.2 parts per million by weight, is furnished, numeral 50. The article substrate preferably comprises a nickel-base superalloy such as Rene' N5 alloy, whose composition is set forth above, with the above-discussed sulfur limitation. The article substrate 32 has the shape of the final desired coated article, with the same dimensions reduced only by an allowance for the thickness, if any, of the protective system. In the case depicted in FIG. 1, the article substrate 32 would have the shape of the turbine blade 20. In a typical commercial operation, the base metal of the article substrate 32 is melted and then cast into the shape of the article substrate by directional solidification to produce an oriented microstructure in the article substrate.

As used herein, "free sulfur" is sulfur present in elemental form and not chemically combined with another element. Free sulfur is to be contrasted with combined sulfur, in which the sulfur is chemically combined with one or more other elements. The total sulfur content is the free sulfur content plus the combined sulfur content. The important distinction between free sulfur and combined sulfur, for the present purposes, is that free sulfur can diffuse to the surface 36 of the substrate 32 and promote the debonding of the protective system 30 from the substrate 32. Combined sulfur, on the other hand, is fixed at a single location and cannot move to the surface of the article substrate.

The article substrate 32 having a free sulfur content of below about 1 part per million by weight can be achieved in several ways. In one, only those heats of material having such a sulfur content would be selected and used to fabricate the article substrate. This approach is expected to have limited usefulness, because most alloys tend to have larger amounts of sulfur present due to their method of melting and casting.

In another and currently preferred approach, a scavenger element that reacts with free sulfur to produce combined sulfur may be present in the molten base metal which is used to make the article substrate. The scavenger element must be present in a sufficient amount to reduce the remaining free sulfur—that sulfur which does not react to produce combined sulfur—to the required low level of less than about 1 part per million by weight. The scavenger element is preferably calcium, which reacts with free sulfur to produce calcium sulfide, or magnesium, which reacts with free sulfur to produce magnesium sulfide.

In another approach, the article substrate is made of a base metal having a free sulfur content of more than about 1 part per million by weight. The article substrate is thereafter processed to reduce its sulfur content to less than about 1 part per million by weight. The preferred processing is achieved by contacting the article substrate to a reducing gas at elevated temperature. The reducing gas reduces and reacts with the sulfur at the surface of the article substrate to produce a gaseous sulfide which is carried away into the gaseous atmosphere. Any native oxide present at the surface of the substrate must not act as a barrier to sulfur removal in this process. If any such barrier is present, it must be removed prior to the sulfur-removal treatment. Sulfur that is initially within the interior of the article substrate diffuses to the surface, and is in turn reduced and reacted to remove it from the substrate. The process is continued until the sulfur content of the article substrate is reduced to the required level. Desulfurization is achieved by heating the article substrate 32 in a reducing atmosphere, preferably 1 atmosphere of flowing hydrogen gas or other hydrogen-containing gas, to a high temperature for a period of time sufficient to react and remove the sulfur from the substrate. For nickel-base superalloys, the desulfurization heat treatment temperature is conducted at at least about 2200° F., to achieve the required degree of desulfurization in a commercially acceptable time. The temperature to which the substrate is heated will depend upon the composition of the substrate. For the preferred Rene N5 substrate, a temperature of about 2250–2340° F. is preferred. For an actual substrate in the form of a turbine blade airfoil, desulfurization was successfully completed by exposure to 1 atmosphere of flowing hydrogen gas at 2336° F. in a time of 100 hours.

The desulfurization treatment, when used, is preferably conducted during melting of the alloy, which is thereafter cast into the desired shape of the article substrate. Equivalently for the present purposes, the desulfurization may be performed after the casting of the base metal to form the article substrate, and just before the deposition of the protective system 30. If the metal is desulfurized prior to forming the article substrate, care must be taken so that sulfur is not re-introduced when the article substrate is formed.

The protective system 30 is formed on the free surface 36 of the substrate 32. The protective layer 34 is formed by any operable process. Preferably, a platinum sublayer is first deposited. The deposition is accomplished by electrodepositing platinum from a platinum-containing solution onto the substrate. An operable platinum-containing solution is an aqueous solution of 4–20 grams platinum per liter of platinum provided as $Pt(NH_3)_4HPO_4$, and the voltage/current source is operated at ½ to 10 amperes per square foot of surface being electroplated. A platinum sublayer about 5 micrometers thick is deposited in 1–4 hours at a temperature of 190–200° F.

An aluminum sublayer is deposited overlying the platinum sublayer 34. The aluminum sublayer is deposited by any operable approach, with vapor deposition preferred. In that approach, a hydrogen halide gas, such as hydrogen chloride, is contacted with aluminum metal or an aluminum alloy to form the corresponding aluminum halide gas. The aluminum halide gas contacts the platinum sublayer already deposited on the substrate, depositing the aluminum thereon. The deposition occurs at elevated temperature such as from about 1925° F. to about 1975° F. so that the deposited aluminum atoms interdiffuse into the platinum layer 34 during a 4 to 20 hour cycle. This technique allows doping or alloying elements to be deposited into the aluminum sublayer if desired, from the halide gas. During this deposition the aluminum sublayer, the platinum sublayer, and the metal of the substrate interdiffuse to form the platinum aluminide. Additional interdiffusion may be accomplished if desired by maintaining the structure at elevated temperature after the flow of halide gas is discontinued. The platinum and aluminum sublayers interdiffused with the substrate form the protective layer 34 that inhibits oxidation and corrosion damage to the airfoil 22, during exposure at intermediate temperatures.

The ceramic layer 38 is optionally applied overlying and contacting the protective layer 34, numeral 54 of FIG. 3. The ceramic layer 38 may be deposited by any operable technique, with electron beam physical vapor deposition (EBPVD) being preferred. Other techniques include, for example, air plasma spray, low pressure plasma spray, and electron beam physical vapor deposition.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A coated turbine engine component comprising:
    an airfoil section, the airfoil section comprising:
        an airfoil substrate comprising a nickel-base superalloy and having a free sulfur content and a combined sulfur content, wherein the free sulfur content plus the combined sulfur content equals total sulfur content, wherein the free sulfur content is more than 0 but less than about 1 part per million by weight; and
        a protective layer at a surface of the airfoil substrate.

2. The component of claim 1, wherein the free sulfur content is less than 1 percent part per million by weight.

3. The component of claim 2, wherein the protective layer comprises a platinum aluminide layer.

4. The component of claim 3, wherein the airfoil substrate has a free sulfur content of less than 0.5 parts per million by weight.

5. The component of claim 3, wherein the airfoil substrate has a free sulfur content of 0.2 parts per million by weight.

6. The component of claim 3, wherein the turbine engine component is a turbine blade and the airfoil section is a turbine blade airfoil.

7. The component of claim 3, wherein the turbine engine component is a turbine vane and the airfoil section is a turbine vane airfoil.

8. The component of claim 4, wherein the turbine engine component is a turbine blade and the airfoil section is a turbine blade airfoil.

9. The component of claim 4, wherein the turbine engine component is a turbine vane and the airfoil section is a turbine vane airfoil.

10. The component of claim 5, wherein the turbine engine component is a turbine blade and the airfoil section is a turbine blade airfoil.

11. The component of claim 5, wherein the turbine engine component is a turbine vane and the airfoil section is a turbine vane airfoil.

12. A coated article, the article comprising:
   a substrate, the substrate having combined sulfur and free sulfur, wherein the free sulfur plus the combined sulfur equals total sulfur, the substrate comprising a nickel-base superalloy having free sulfur content of more than 0 but less than about 1 part per million by weight and at least one scavenger element, at least some of the at least one scavenger element being chemically bound with sulfur as combined sulfur; and
   a protective layer at a surface of the substrate, the protective layer comprising a platinum aluminide diffusion layer.

13. The coated article of claim 12, wherein one of the at least one scavenger element is hafnium.

14. The coated article of claim 12, wherein one of the at least one scavenger element is zirconium.

15. The coated article of claim 12, wherein one of the at least one scavenger element is magnesium.

16. The coated article of claim 12, wherein one of the at least one scavenger element is calcium.

17. The coated article of claim 12, wherein the coated article is a component of a gas turbine engine.

18. The coated article of claim 17, wherein the component is a turbine vane.

19. The component of claim 17, wherein the component is a turbine blade.

20. The component of claim 17, wherein the component is a turbine nozzle.

21. The component of claim 17, wherein the component is a combustor liner.

22. The component of claim 17, wherein the component is a turbine seal.

23. The component of claim 17, wherein the component is an exhaust nozzle.

24. The component of claim 17, where the component is a shroud.

25. A coated article comprising:
   a substrate, the substrate having a combined sulfur content and a free sulfur content, wherein the free sulfur content plus the combined sulfur content equals total sulfur content, the substrate comprising a nickel-base superalloy and having free sulfur content of more than 0 but less than 1 part per million by weight;
   the substrate further including at least one scavenger element selected from the group of elements consisting of hafnium, zirconium, magnesium, calcium, and combinations thereof, wherein the at least one scavenger element is chemically bound to form the combined sulfur content; and
   a protective layer at a surface of the substrate.

* * * * *